United States Patent [19]

Inui et al.

[11] Patent Number: 5,574,693
[45] Date of Patent: Nov. 12, 1996

[54] SEMICONDUCTOR MEMORY DEVICE

[75] Inventors: Takashi Inui, Tsuchiura; Kiyotaka Okuzawa, Tsukuba; Yoshihiro Ogata, Tsuchiura, all of Japan

[73] Assignee: Texas Instruments Incorporated, Dallas, Tex.

[21] Appl. No.: 473,405

[22] Filed: Jun. 7, 1995

Related U.S. Application Data

[62] Division of Ser. No. 105,203, Aug. 10, 1993, Pat. No. 5,544,796.

[51] Int. Cl.$^6$ ................................................ G11C 13/00
[52] U.S. Cl. .................................... 365/201; 365/218
[58] Field of Search ........................... 365/201, 218, 365/230.01, 230.06, 189.11

[56] References Cited

U.S. PATENT DOCUMENTS

| | | | |
|---|---|---|---|
| 4,575,823 | 3/1986 | Fitzpatrick | 365/218 |
| 4,587,629 | 5/1986 | Dill et al. | 365/218 |
| 4,890,263 | 12/1989 | Little | 365/218 |

FOREIGN PATENT DOCUMENTS

| | | |
|---|---|---|
| 0101107 | 2/1984 | European Pat. Off. . |
| 0223188 | 5/1987 | European Pat. Off. . |
| 2516973 | 10/1976 | Germany . |

*Primary Examiner*—Terrell W. Fears
*Attorney, Agent, or Firm*—Dana L. Burton; James C. Kesterson; Richard L. Donaldson

[57] ABSTRACT

A semiconductor memory device characterized by the fact that the disturb test time of the semiconductor memory device can be shortened, and the power consumption can be cut.

In the disturb test for the semiconductor memory device in this invention, multiple word lines are selected at the same time with a prescribed interval corresponding to the element isolation layout. As the word lines are selected corresponding to the element isolating layout, the interference caused by the element isolation state can be excluded. Since multiple word lines are selected at the same time, the time of operation can be shortened. Since the word lines are maintained in the selected state while the sense amplifiers are not reset, there is no increase in the power consumption although multiple word lines are selected at the same time.

5 Claims, 6 Drawing Sheets

| MAT A | S/A | MAT B | S/A | MAT C | S/A | MAT D | S/A | Y-DEC | S/A | MAT I | S/A | MAT J | S/A | MAT K | S/A | MAT L |
|---|---|---|---|---|---|---|---|---|---|---|---|---|---|---|---|---|
| X-DEC ||||||||| X-DEC ||||||||
| MAT E | S/A | MAT F | S/A | MAT G | S/A | MAT H | S/A | Y-DEC | S/A | MAT M | S/A | MAT N | S/A | MAT O | S/A | MAT P |

SEMICONDUCTOR MEMORY DEVICE

This is a division of application Ser. No. 08/105,203, filed Aug. 10, 1993 now U.S. Pat. No. 5,544,796.

This invention concerns a type of semiconductor memory device.

In particular, this invention concerns a type of semiconductor memory device having the disturb test function.

PRIOR ART

For semiconducter memory devices, such as dynamic RAM (DRAM), the following two types of tests may be performed: the static test (pause test) in which the periphery of the memory cell as the test subject is kept unchanged, and the maintenance characteristics of the memory cell are tested; and the dynamic test (disturb test) in which the peripheral conditions of the memory cell as the test subject are changed so as to test for the cell interference, digit line defects, poor operation of the sense amplifier, poor output lines, etc.

This invention concerns in particular a type of semiconductor memory device having the latter disturb test function.

Usually, the memory cell region of a DRAM may be divided into small memory blocks, that is, memory cell collections known as mats or arrays. For each of the mats, selection and activation are performed, and reading/writing of information is performed. This can be explained with reference to the example of the 4 Mb DRAM shown in FIG. 6.

Figure 6:
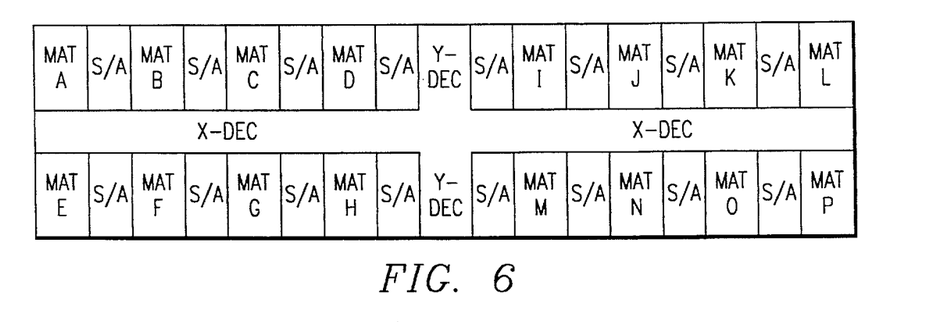
FIG. 6 shows the general layout configuration of the semiconductor memory device.
Figure 7A:
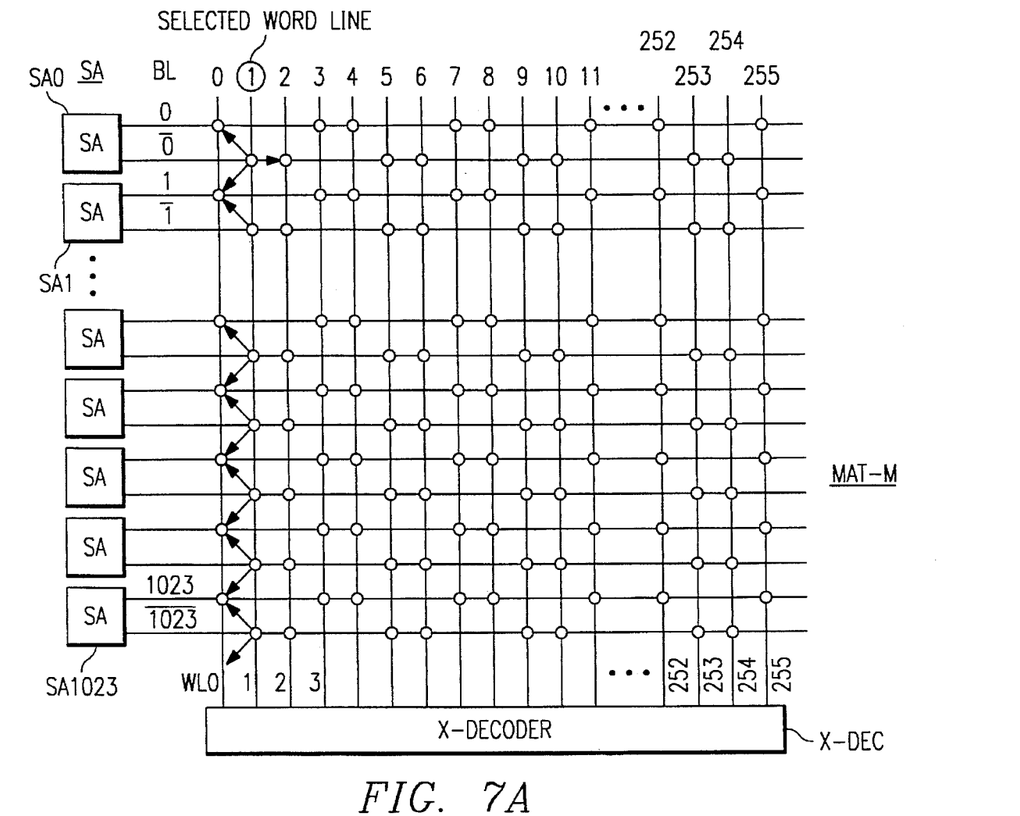
FIG. 7 is a detailed configuration diagram of one mat in the semiconductor memory device shown in FIG. 6.
Figure 7B:
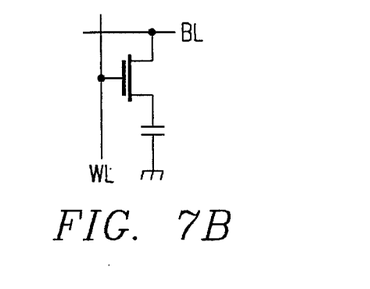

In this example, the memory region is divided into 16 regions ranging from mat A to mat P. In this case, when the address input from the exterior is X=0, Y=0, among the aforementioned mats, the four mats A, E, I, and M are activated. As shown in FIG. 7(B), one cell is connected to one word line WL and one bit line BL. Consequently, as shown in FIG. 7(A), one mat is made of a total of 256 K bit cells, including 256 word lines and 1024 bit lines. When the mat is activated, one word line is selected from the 256 word lines corresponding to the X-address input from the exterior, and the data of the 1024 cells connected to this word line are transmitted to the bit lines. When sense amplifier SA is turned on, the data of these cells are amplified, and the amplified values are reloaded into the cells (refresh operation). In addition, among the 1024 sense amplifiers SA connected to one word [line], one sense amplifier is selected corresponding to the Y-address. Through this sense amplifier, the datum of the cell is accessed (read/write).

Figure 8A:
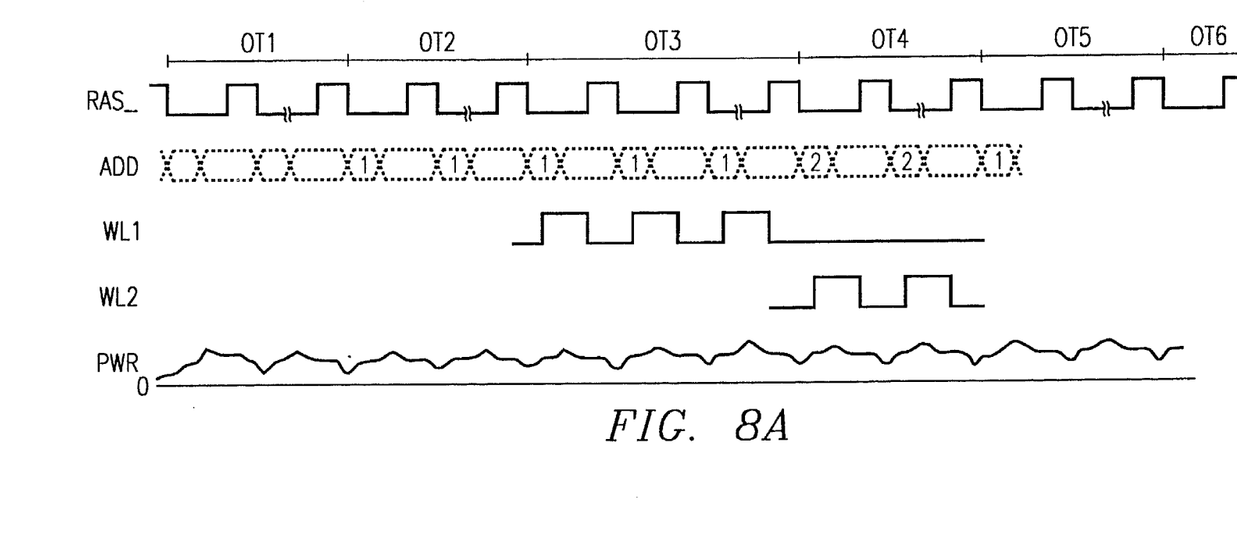
FIG. 8 shows the timing chart in the test method of the semiconductor memory device in the conventional scheme. In reference numerals as shown in the drawings 1, memory matrix array block 2, bit line group 3, word line group 5, sense amplifier 7, X-decoder circuit
Figure 8B:
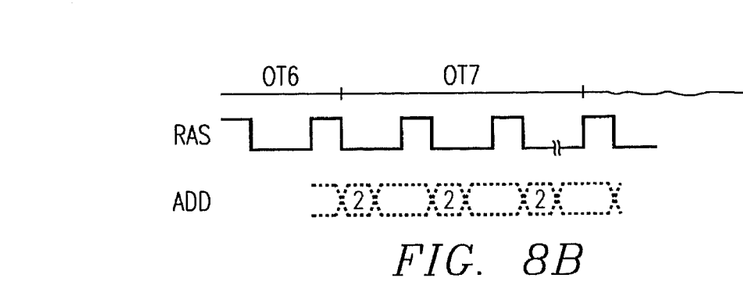

In this case, the power consumption of the DRAM is the sum of the power consumptions for driving X/Y address buffers, X/Y decoders, word lines, sense amplifier, control circuit, etc. With reference to FIG. 8, the operation of the DRAM may be explained from the viewpoint of the power consumption. First of all, when RAS (ROW ADDRESS STROBE) signal changes from the Hi[gh] level to the Low level, the X address buffer acts, and the X-address input from the exterior is fetched into the interior. Then, the X-decoder acts. Corresponding to this address, the word line is selected and driven (at this time, the power is consumed first). When the word line has the data of the driving cell transmitted to the bit line, the sense amplifier acts to amplify the data of the bit line (at this time, new power consumption takes place). With the aid of the CAS signal, the Y-address signal is fetched, followed by the subsequent operations. When the read/write operation of the data or the refresh operation is ended, the RAS signal takes on the Hi level; the address buffer, decoder, and word line are reset; the bit line and the sense amplifier are recharged; and one cycle is ended. In this series of operations, most of the power consumption is due to driving of the sense amplifiers. Since the bit line pair is connected to the sense amplifier, the power consumption takes place as charge/discharge takes place.

In a dynamic memory, the information is recorded in the form of charge. Consequently, when memory cells are not refreshed (rewritten) within a prescribed time interval, the information will be lost due to leakage to the substrate, etc. The characteristics in this case are defined as tREF (refresh, wait time). The test performed in this time interval is usually known as pause test or disturb test. In the practical disturb test, at each time point, a certain cell is concerned, with write/read operation performed for the peripheral cells, and with tests being performed on whether there is any change in the information of the concerned cell caused by change in the other cells, bit lines, and other external factors.

In the following, explanation will be presented with reference to the flow chart of the disturb test of the cell of the 4 Mb DRAM shown in FIG. 8. In this example, the cell configuration adopted is the "1-word line, ½-bit line pitch" configuration. At the first operation timing OT1, the RAS signal is changed, and level "1" is written into the cells connected to all of the word lines including WL0 and WL2. Then, at the second operation timing OT2, level "0" is written into the cells connected to word line WL1. After the write operation, when X=1 (WL1) is selected, the data of the cells connected to word line WL1 are read. The value of the data is amplified by the sense amplifier and is then reloaded. In other words, the disturb test is performed for the cells connected to X=0, X=2 (WL0, WL2) with their X-addresses sequentially related to each other. Then, at the third operation timing OT3, word line WL1 is selected for several cycles in a prescribed time (a time determined from tREF, such as 64 msec). Then, at the fourth operation timing OT4, the data of the cells connected to word lines WL0 and WL2 are read. Checking is performed on whether the datum initially loaded as "1" remains as "1" or has changed to "0." If it has been changed to "0," it means that the data have been damaged.

At the cycle of the fifth operation timing OT5 and the sixth operation timing OT6, refreshing operation is performed for the cells other than the test subject, and the initial value is reset for the cells used inn the disturb test, that is, the cells of word line WL1 in this example.

In this example, the mats that are activated simultaneously are 4 mats, that is, a quarter of the 16 mats. Consequently, the same test is also performed for the remaining three quarters of the mats. In this test, most of the test time is not for the read/write operation of the cells, instead, it is used as the disturb operation period determined by a product of tREF and the refresh cycle number (256×4). For 64 MB, the test time is 64 msec×8 K cycles=512 sec. This is a problem.

In order to shorten the test time of the disturb test, a method has been proposed, in which the odd-numbered or even-numbered X-addresses (word lines) are selected at the same time, that is, every other word line is selected.

FIG. 7(A) illustrates the diagram of a portion of the case when every other word line is selected. In this case, for example, the even-numbered word lines WL0, WL2, WL4, . . . WL254 are selected at the same time; for the memory cells connected to the odd-numbered lines, such as WL1, test is performed for the damage of the data in the memory caused by interferences from the adjacent word lines WL0 and WL2. Since alternate groups of multiple word lines are selected, the disturb test time can be shortened.

In the conventional "1-word line, ½-bit line pitch" configuration, if alternate groups of multiple word lines are selected, the test time can be shortened. However, for the high-density memory cells (over 64 Mb), the ¼-bit line pitch seems to be more useful than the ½-bit line pitch from the viewpoint of the cell configuration. In this case, in the disturb test, determination of the configuration of the adjacent cells also includes consideration of the layout of the cells in addition to the two adjacent lines of the cell. In the example shown in FIG. 7, for example, when the disturb test is performed for the cells connected to word line WL5, word lines WL2, WL3, WL4, as well as WL6, WL7, and WL8 have influences on the cell. Consequently, in this case, if every other word line is selected, test cannot be carried out for the cells connected to word lines WL3 and WL7. This is undesirable.

In addition, in the conventional disturb test where one word line is selected, the test time is very long. On the other hand, when multiple word lines are selected, the instant current becomes very high. Both are problematic.

SUMMARY OF THE INVENTION

The purpose of this invention is to enable the intrinsic disturb test with the aid of the element isolating layout of the memory cells, and to reduce the power consumption in the disturb test.

The first portion of this invention provides a type of semiconductor memory device characterized by the fact that it consists of the following parts: memory cells arranged in a matrix configuration, bit lines and word lines used for selecting the aforementioned memory cells, sense amplifiers connected to the aforementioned bit lines, and an address decoder circuit, which has a test mode in which multiple word lines can be selected almost at the same time with a prescribed interval corresponding to the element isolating layout of the memory cells, and which is connected to the aforementioned word line and selectively drives the aforementioned word line corresponding to the address signal.

Preferably, this invention provides a type of semiconductor memory device characterized by the fact that when the aforementioned address decoder circuit is in the aforementioned test mode, the aforementioned word lines are driven in sequence with a prescribed delay time; and when the aforementioned word line is driven, the sense amplifier is not reset in this operation mode.

Multiple word lines are selected and driven at the same time in consideration of the mutual interference corresponding to the element isolating layout of the memory cells. Since multiple word lines are driven at the same time, the test time of the disturb test can be shortened, and the intrinsic disturb test can be performed corresponding to the element isolating layout.

Since the selected word lines are maintained in the ON state, while the word lines are selected in sequence, the increase in the power consumption accompanying with the new sense amplifier operation can be suppressed, and thus the power consumption can be reduced.

DESCRIPTION OF THE PREFERRED EMBODIMENTS

In the following description, the semiconductor memory device in this invention will be explained in more detail with reference to embodiments thereof.

Figure 1:
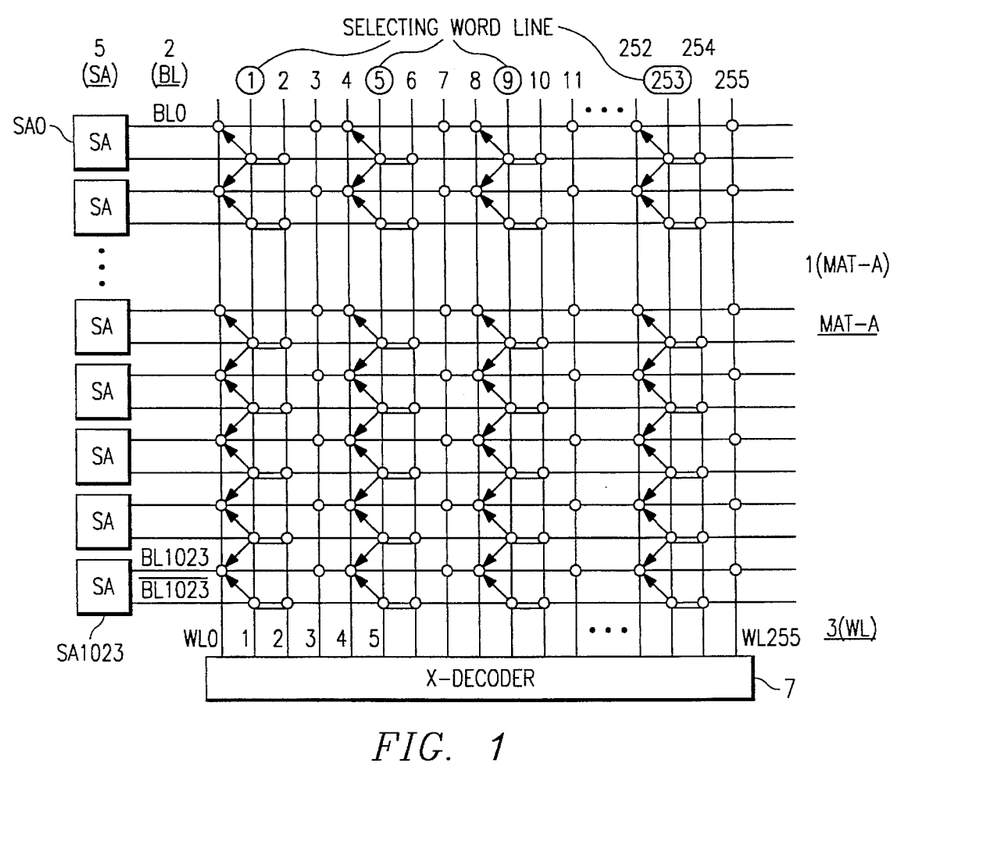
FIG. 1 is a diagram illustrating the memory cell driving method in the semiconductor memory device in this invention.

FIG. 1 shows the configuration of the memory cell in an embodiment of this invention.

The volume of memory cells in each mat is 256 KB as defined by bit line group 2 made of 1024 bit lines and word line group 3 made of 256 word lines. The 1024 bit line pairs BL0, NBL0 (where N represents inverted state. In the figure, a bar on BL indicates the inverted state), . . . BL1023, NBL1023 are connected to sense amplifier group 5 made of 1024 sense amplifiers SA0, SA1, . . . , SA1023.

256 word lines WL0, WL1, . . . WL255 are connected to X-decoder circuit 7.

Figure 2:
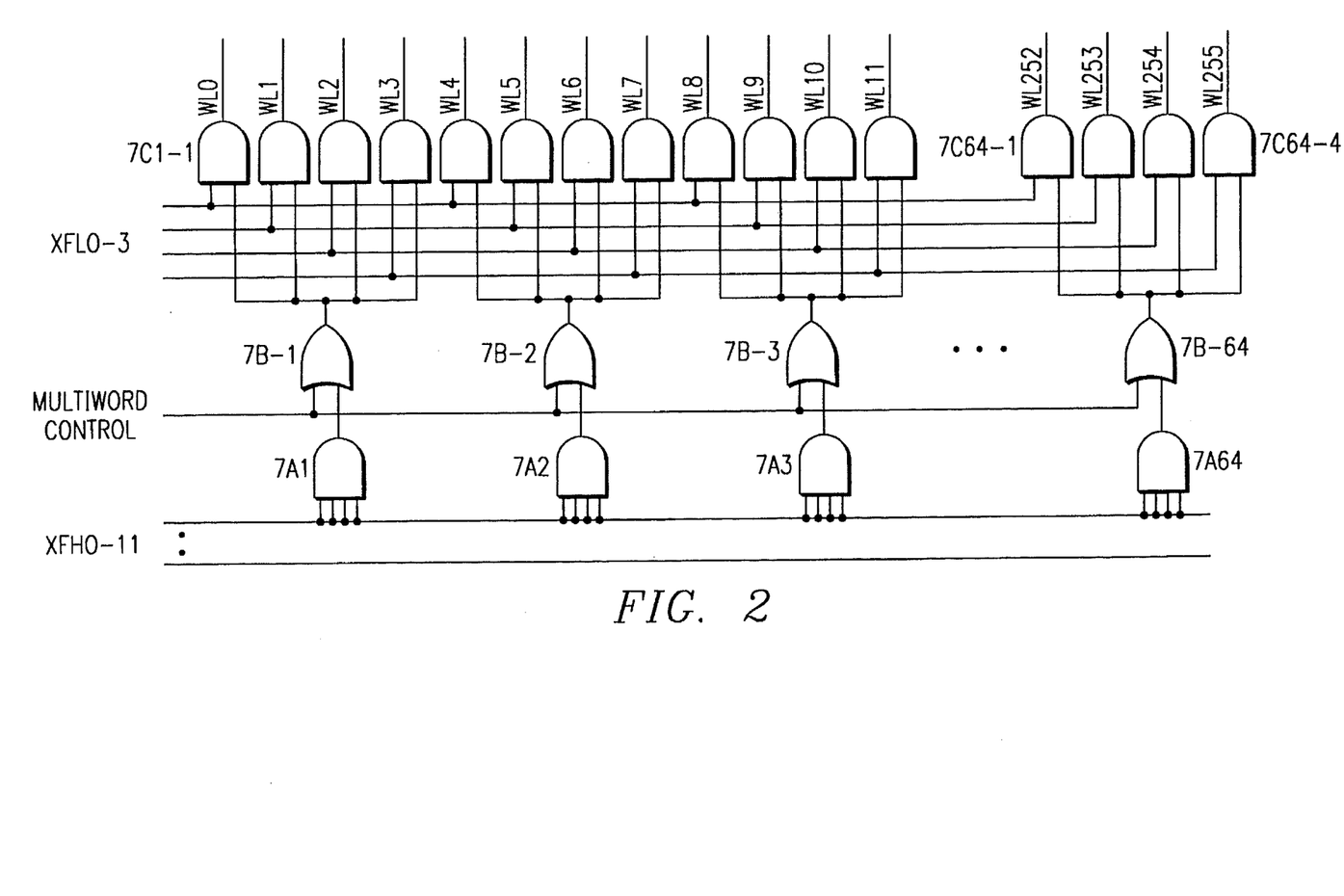
FIG. 2 is a circuit diagram of the decoder in the semiconductor memory device in FIG. 1.

FIG. 2 is a detailed circuit diagram of X-decoder circuit 7.

X-decoder circuit 7 consists of first-section AND gates 7A1, 7A2, . . . 7A64, second-section OR gates 7B-1, 7B-2, . . . 7B-64, as well as third-section AND gate group 7C1, 7C2, . . . 7C64.

256 word lines WL0, . . . WL255 are connected to third-section AND gate group 7C1, . . . 7C64.

Each of the third-section AND gate groups is made of four parallel-connected AND gates, such as 7C1-1, 7C1-2, . . . 7C1-4.

FIGS. 1 and 2 illustrate examples when the word lines are selected at the same time 4 lines apart.

In the example shown in FIG. 1, level "1" is written as the initial value for all of the cells. Then, for example, level "0" is written as data into all of the cells connected to WL1, WL5, WL9, . . . WL253. Then, a special operation mode is performed for the device. For example, this special operation mode is started when a high voltage is applied to a prescribed input pin.

In order to perform the disturb test, word line WL1 is selected and driven. At the same time, word lines WL5, WL9, ... WL253 are also driven. In this case, the disturb test is carried out for the cells connected to the word lines not selected. Afterwards, the data of the cells connected to the word lines not selected, that is, WL0, 2, 3, 4, 6, ... 252, 254, 255, are read and are checked to see if they are defective.

Then, the same test as that for word line WL1 is carried out for word lines WL0, WL2, WL3.

FIG. 2 can be used to present the details of the operation of the routine mode and the disturb test mode, respectively.

In the routine mode, with the aid of the first predecode signal XFH0, XFH1, ... FFH11, that is, the X-address from a predecoder (not shown in the figure), one gate of the corresponding AND gates 7A1, 7A2, ... 7A64 is selected, and the output takes on the Hi level. For example, when the X-address is 0 (FH0), only the output of 7A1 becomes Hi level.

In the routine mode, the multiword control signal takes on the Low level; hence, only the output of 7B1 becomes Hi level. In addition, corresponding to the X-address input from the exterior, from the predecode signal XFL0, one out of three takes on the Hi level; since X-address becomes 0, only the output of 7C1-1, that is, word line WL0, is selected and driven to the Hi level.

On the other hand, in the disturb test mode, selection of AND gates 7A1, ... 7A64 is not related to first predecode signal XFH0, XFH1, ..., XHF11. That is, when a multiword control signal is output from the predecoder and the multiword control signal becomes Hi, OR gates 7B-1, 7B-2, ... 7B-64 are selected at the same time.

When OR gates 7B-1, 7B-2, ... 7B-64 are selected at the same time, with the aid of the 4-bit second predecode signal XFL0-3 from the predecoder, the AND gates corresponding to AND gate groups 7C1, 7C2, ... 7C64 are activated, and word lines WL connected to these AND groups are selected at the same time.

For example, if X-address is 0, that is, if the second predecode signal XFL0 is input, word lines WL0, WL4, WL8, ... WL252 are selected at the same time.

Figures 3, 4:
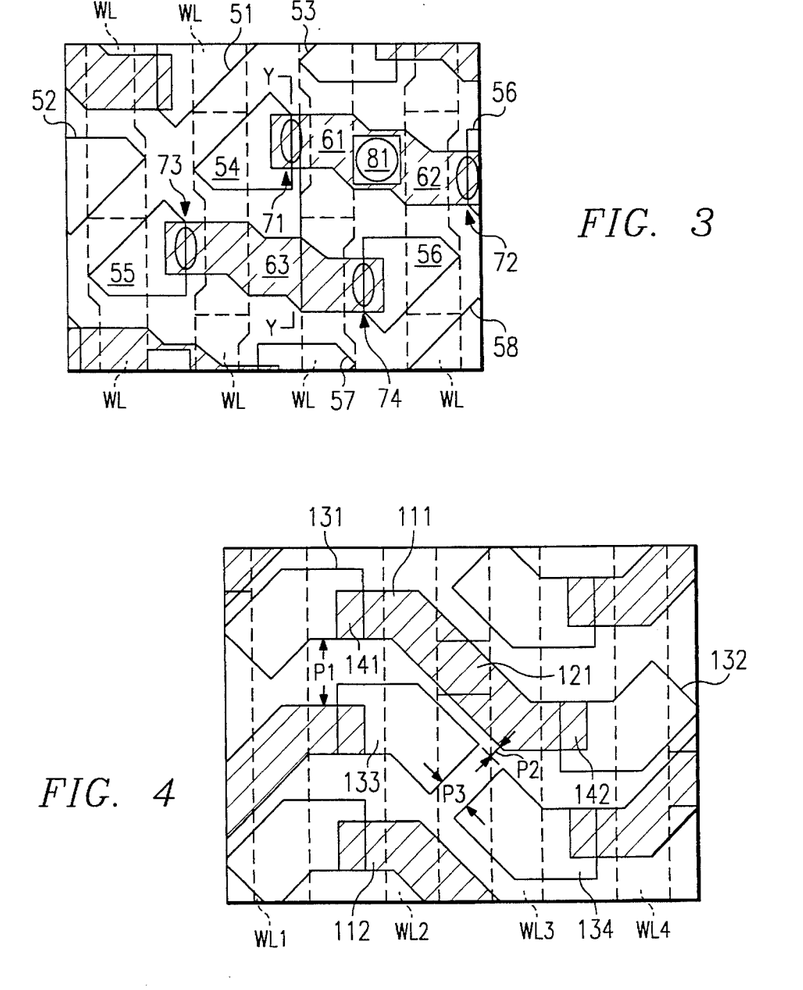
FIG. 3 shows the element isolating layout of the 1-word line, ½-bit line pitch design used as an example of the test method of the semiconductor memory device in this invention.
FIG. 4 shows the element isolating layout of the 1-word line, ¾-bit line pitch design used as another example of the test method of the semiconductor memory device in this invention.

FIG. 3 shows the element isolating layout of the memory cells as an example of the "1-word line, ¼ (quarter) bit line pitch." In this example, the plane view of a stack-in-trench DRAM is shown, where eight stack-in-trenches 51–58 with the shape of home plate on a baseball field are formed, and mode regions 61, 62 are formed at positions different in the bit line direction and with bit line contact 81 at the center. In this case, bit line BL is set in the direction at right angle to word line WL.

In this layout with 1 word line, ¼ bit line pitch, a displacement of one word line, is a displacement in the bit line direction of only ¼ line.

In the example shown in FIG. 3, as pointed out in the above, when word line WL5 is selected and driven, the disturb test can be carried out not only for the adjacent word lines WL4 and WL6, but also for word lines WL2, Wl3, and WL7, WL8.

In this example, since 64 lines instead of 1 line can be selected at the same time, the test time can be shortened by a factor of 64.

For the simultaneous selection and driving of the word lines presented here, it is necessary to consider it corresponding to the layout of the memory cells. FIG. 4 shows the layout of "1-word line ¾-bit line pitch" design as another embodiment of this invention. In this layout, with bit line contact portion 121 as the center, mode region 111 is extended to word lines WL2, WL3, which are arranged at an angle of about 45° to multiple word lines WL and multiple bit lines (not shown) orthogonal to these word lines WL. The tip of the extension is parallel to the bit line. In other words, [the mode region] is formed by extending to between word line WL, which is orthogonal and adjacent to word line WL [sic], and its neighboring word line WL [sic], such as between word line WL3, which is between word line WL1 and word line WL2, and word line WL4.

Stack-in trench regions 131, 132 are formed at contact portions 141, 142 at the tip of the mode regions stretching parallel to each other. Stack-in trench regions 133, 134 are formed between adjacent mode regions 111, 112 and they are parallel to these mode regions 111, 112.

As explained above with reference to FIGS. 1 and 2, in this type of "¾-bit line pitch," the simultaneous selection of the word lines is performed, say, two lines apart.

Since multiple word lines are selected at the same time two lines apart, the disturb test time can be shortened to $2/256 = 1/128$.

Figure 5A:
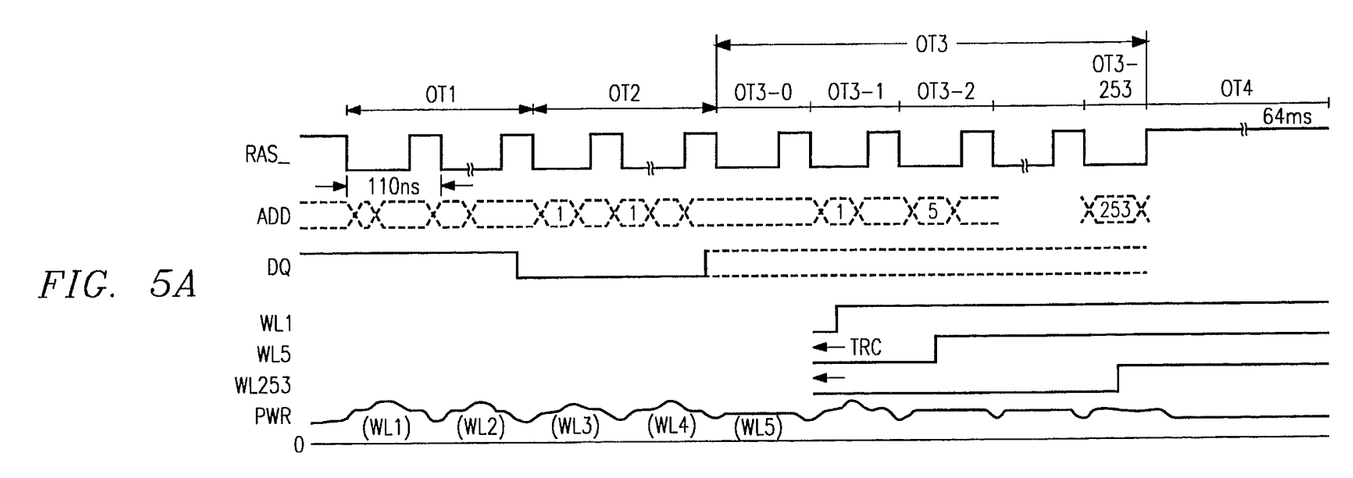
FIG. 5 shows the operation timing chart of the DRAM as an application example in this invention.
Figure 5B:
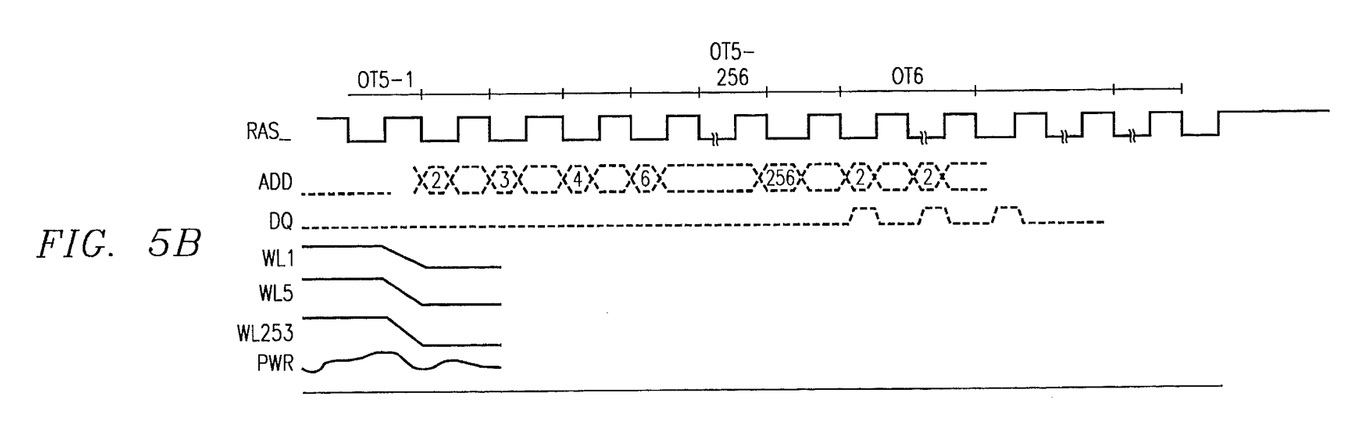

FIG. 5 illustrates the method used for reducing the power consumption in the disturb test as another embodiment of this invention.

The basic idea is as follows: in the previous embodiments, multiple word lines are selected at the same time in a mat. When the selection operation is performed with a slight shift in time instead of selecting them all at the same time, the peak current of the current consumed add the [total] consumed current of the sense amplifiers can De reduced. The following is a detailed explanation of this scheme.

In this case, the explanation may be made with reference to FIG. 1.

In the first operation timing OT1, "1" is written into all of the cells. In this example, the operation time of 1 cycle for the RAS signal is 110 nsec.

In the second operation timing OT2, the word lines are selected with an interval of 4 word lines. Selection is carried out in the sequence of word lines WL1, WL5, ... WL253. Datum "0" is written into the cells connected to the word lines.

In the third operation timing, the disturb test is carried out. At this time, refresh is carried out in the selected sequence of word lines WL1, WL5, WL9, ... WL253 (with reference to the cycle from OT3-1 to OT3-253). In routine operation, after selection of word line WL1, when word line WL5 is selected, word line WL1 becomes deselected, and a low-level voltage is applied. However, in this example, even for the different word line WL1, the state is kept on Hi level without resetting. For the sense amplifier, usually driving and precharging are performed in each cycle in synchronization with the RAS signal. However, in this case, the operation becomes different. After resetting word line WL1, although the sense amplifier is driven just as in the routine case, word line WL1 is not reset while word line WL5 is driven, and the sense amplifier is also kept at the driving state without precharge. In this way, it is possible to suppress the power consumption when the word line is selected and when the disturb test is carried out. The overall time of the period of the third operation timing OT3 is 110 nsec×64, and the sum is about 7 μsec for the four steps.

In the fourth operation timing OT4, refresh is performed for a time of 64 msec, and the disturb test is carried out.

In the fifth operation timing, the system enters the mode with the disturb test ended. All of the word lines selected in the first step OT5-1 are slowly erased (OFF). This is for reducing the power consumption. In the later steps OT5-2, etc., word lines Wl2, WL3, WL4, WL6, . . . WL256 are selected and refresh is performed for the cells connected to them.

In the sixth operation timing, read is performed for WL2, WL3, WL4, WL6, . . . WL256. If the datum read out is "1," the result of the disturb test is taken as normal. On the other hand, if "0" is read, the data are taken as defective. In this application example, the disturb test time can be shortened by almost 64 times (527 sec/64=about 8.3). Since the sense amplifiers are not reset, the power consumption of the sense amplifiers can be reduced.

In the above, this invention was explained with reference to the application examples of DRAM. Of course, the test method of the semiconductor memory device in this invention is not limited to them.

As explained above, in the semiconductor memory device of this invention, the disturb test time can be shortened.

Also, this invention can reduce the power consumption in the disturb test.

We claim:

1. A method of operating a semiconductor memory device comprising:

inputting a multiword control signal to a decoder circuit of said device;

inputting first predecode signals to said decoder circuit;

inputting second predecode signals to said decoder circuit;

selectively driving word lines of said device based on the states of said multiword control signals, said first predecode signals and said second predecode signals.

2. The method of claim 1, wherein said first predecode signals are used in a routine mode to select and drive said word lines individually.

3. The method of claim 1, wherein said multiword control signal and said second predecode signals are used in a test mode to selectively drive a plurality of said word lines.

4. The method of claim 3, wherein a different plurality of said word lines are selectively driven when the states of said multiword control signal and said second predecode signals are changed.

5. The method of claim 3, wherein said selectively driven word lines are driven in sequence with a prescribed delay time.

* * * * *